(12) United States Patent
Wen et al.

(10) Patent No.: US 10,644,481 B2
(45) Date of Patent: May 5, 2020

(54) OPTICAL COMPONENT PACKAGING STRUCTURE, OPTICAL COMPONENT, OPTICAL MODULE, AND RELATED APPARATUS AND SYSTEM

(71) Applicant: HUAWEI TECHNOLOGIES CO., LTD., Shenzhen, Guangdong (CN)

(72) Inventors: Yue Wen, Shenzhen (CN); Zhiguang Xu, Shenzhen (CN); Sulin Yang, Shenzhen (CN)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/111,727

(22) Filed: Aug. 24, 2018

(65) Prior Publication Data

US 2019/0013643 A1 Jan. 10, 2019

Related U.S. Application Data

(63) Continuation of application No. PCT/CN2016/074671, filed on Feb. 26, 2016.

(51) Int. Cl.
*H01S 5/024* (2006.01)
*G02B 6/42* (2006.01)
(Continued)

(52) U.S. Cl.
CPC ............ *H01S 5/02415* (2013.01); *G02B 6/42* (2013.01); *G02B 6/428* (2013.01); *G02B 6/4268* (2013.01);
(Continued)

(58) Field of Classification Search
CPC ............. H01S 5/02415; H01S 5/02212; H01S 5/02476; G02B 6/428
See application file for complete search history.

(56) References Cited

U.S. PATENT DOCUMENTS 6,418,019 B1 7/2002 Snyder et al.
6,852,928 B2 2/2005 Giaretta et al.
(Continued)

FOREIGN PATENT DOCUMENTS

CN 1498522 A 5/2004
CN 200966201 Y 10/2007
(Continued)

OTHER PUBLICATIONS

Young-Tak Han et al, A cost-effective 25-Gb/s EML TOSA using all-inone FPCB wiring and metal optical bench. Optics Express, Nov. 4, 2013 | vol. 21, No. 22, 10 pages.

*Primary Examiner* — Armando Rodriguez
(74) *Attorney, Agent, or Firm* — Womble Bond Dickinson (US) LLP

(57) ABSTRACT

An optical component packaging structure includes a base, a sealing cover, and a cooler. The base includes a mounting surface and a back surface that faces a direction opposite to that faced by the mounting surface. The cooler includes a cooling plate, a heat dissipation plate disposed opposite to the cooling plate, and a conductive connection body connecting the cooling plate and the heat dissipation plate. The cooling plate includes a cooling surface. The cooler is partially built in the base. The cooling plate faces a direction the same as the mounting surface. The sealing cover covers the mounting surface, and the sealing cover and the mounting surface form a sealing cavity. The cooling surface is located inside the sealing cavity. The heat dissipation plate protrudes from the back surface and is sealedly connected to the base.

19 Claims, 4 Drawing Sheets

(51) Int. Cl.
*H05K 7/20* (2006.01)
*H01L 23/367* (2006.01)
*H01S 5/022* (2006.01)

(52) U.S. Cl.
CPC .......... *G02B 6/4284* (2013.01); *H01L 23/367* (2013.01); *H01S 5/02212* (2013.01); *H01S 5/02476* (2013.01); *H05K 7/20* (2013.01)

(56) References Cited

U.S. PATENT DOCUMENTS

| | | |
|---|---|---|
| 8,223,498 B2 | 7/2012 | Lima |
| 2005/0207459 A1* | 9/2005 | Yu .......................... F25B 21/02 372/36 |
| 2009/0110014 A1 | 4/2009 | Miller et al. |
| 2014/0376579 A1* | 12/2014 | Wach .................. H01S 5/02212 372/34 |
| 2015/0256261 A1 | 9/2015 | Ho et al. |
| 2016/0081179 A1* | 3/2016 | Stella .................. H05K 1/0204 361/720 |

FOREIGN PATENT DOCUMENTS

| | | |
|---|---|---|
| CN | 101359604 A | 2/2009 |
| CN | 102650718 A | 8/2012 |
| CN | 203119289 U | 8/2013 |
| CN | 105098045 A | 11/2015 |
| WO | 03069749 A1 | 8/2003 |
| WO | 2009155707 A1 | 12/2009 |

\* cited by examiner

OPTICAL COMPONENT PACKAGING STRUCTURE, OPTICAL COMPONENT, OPTICAL MODULE, AND RELATED APPARATUS AND SYSTEM

CROSS-REFERENCE TO RELATED APPLICATION

This application is a continuation of International Patent Application No. PCT/CN2016/074671 filed on Feb. 26, 2016, the disclosure of which is hereby incorporated by reference in its entirety.

TECHNICAL FIELD

The present disclosure relates to the field of optical communications technologies, and in particular, to an optical component packaging structure, an optical component, an optical module, and a related apparatus and system.

BACKGROUND

In an optical communications system, an optical module is mainly configured to implement optical-to-electrical conversion and electrical-to-optical conversion, that is, convert a to-be-sent data signal into an optical signal and send the optical signal to a peer end by using an optical fiber, and after receiving, from the optical fiber, an optical signal sent by the peer end and converting the optical signal into an electrical signal, recover received data from the electrical signal.

Currently, an optical component mainly has two packaging manners: a miniature device (XMD) and a Transistor-Outline Can (TO-CAN). If precision of a transmit wavelength of an optical transmitter needs to be ensured, the optical transmitter needs to have a cooling function. In an existing solution, thermoelectric coolers (TECs) are all packaged inside a housing (a TO-CAN or an XMD). Most TECs are placed above a base of the optical component. However, a principle of the TEC is to manufacture the TEC by using a Peltier effect of a semiconductor material. The Peltier effect is a phenomenon that when a direct current passes through a galvanic couple formed by two types of semiconductor materials, one end of the galvanic couple absorbs heat, and the other end dissipates heat. In a current existing typical design, the TECs are all placed inside the packaging housing (the TO-CAN or the XMD). That is, heat absorption and heat dissipation phenomena of the TEC exist in one environment. The heat dissipation phenomenon causes an increase in temperature of the packaging housing and an increase in a temperature inside the housing. This increases a cooling burden of the TEC. That is, power consumption of the TEC is increased and precision of the optical transmitter is affected.

SUMMARY

Embodiments of the present disclosure provide an optical component packaging structure and an optical component, to resolve a technical problem that an existing optical component has high power consumption for heat dissipation.

The present disclosure further provides an optical module and a related apparatus and system.

The optical component packaging structure in the present disclosure includes a base, a sealing cover, and a cooler. The base includes a mounting surface and a back surface that faces a direction opposite to that faced by the mounting surface. The cooler includes a cooling plate, a heat dissipation plate disposed opposite to the cooling plate, and a conductive connection body connecting the cooling plate and the heat dissipation plate. The cooling plate includes a cooling surface. The cooler is partially built in the base. The cooling plate faces a direction the same as the mounting surface. The sealing cover covers the mounting surface, and the sealing cover and the mounting surface form a sealing cavity. The cooling surface is located inside the sealing cavity. The heat dissipation plate protrudes from the back surface and is sealedly connected to the base. In the optical component packaging structure, the cooler is integrated with the base, so that the cooling plate and the heat dissipation plate are placed in two different spaces, thereby avoiding a problem in a conventional solution that temperature inside the cavity of the packaging structure increases due to coexistence of heat absorption and heat dissipation of the cooler in one sealed environment, avoiding an increase in a cooling burden of the cooler, and effectively reducing power consumption of the cooler.

The cooler is a semiconductor cooler, and is manufactured mainly by using a Peltier effect of a semiconductor material. The Peltier effect is a phenomenon that when a direct current passes through a galvanic couple formed by two types of semiconductor materials, one end of the galvanic couple absorbs heat, and the other end dissipates heat, so as to implement heat conduction.

The base in the present disclosure includes an installation through groove. The installation through groove is provided on the mounting surface and penetrates the back surface. The cooler is partially accommodated in the installation through groove. In the structure, the cooler can be directly installed onto the base from the back surface. The installation is convenient and a manufacturing process is simple.

An area of the cooling plate is less than an area of the heat dissipation plate. An increase in a contact area between the outside and the heat dissipation plate facilitates quick heat dissipation of the heat dissipation plate.

An outer surface of the sealing cover is coated with an insulation layer. The insulation layer prevents external heat from entering the cavity from the sealing cover, so that the power consumption of the cooler can be reduced.

The heat dissipation plate includes a peripheral side surface, and the peripheral side surface is sealedly connected to the installation through groove in a manner of soldering or sticking. Soldering materials are gold and tin, but are not limited to the gold and tin. Sealing of the heat dissipation plate and the installation through groove is to isolate the cavity from the outside, thereby preventing an external factor from affecting performance of the cavity.

Several conductive connection pins are further disposed on the base, and the conductive connection pins are used for cable arrangement of the optical component packaging structure. In another implementation, a ceramic conductive connection body penetrating the mounting surface and the back surface is further disposed on the base. The conductive connection pins are used for signal transmission and cable arrangement.

The present disclosure further provides an optical component. The optical component includes the optical component packaging structure and an optical transmit element. The optical transmit element is disposed on the cooling surface of the base. The optical component is any one to which the optical component packaging structure in the present disclosure can be applied. The cooling plate and the heat dissipation plate are placed in two different spaces.

Therefore, heat inside the sealing cavity of the optical component can be effectively conducted and dissipated, so as to avoid a problem in a conventional solution that a current of the cooler increases due to an increase in temperature inside the cavity of the optical component, thereby avoiding impact on precision of a transmit wavelength of the optical transmit element, and effectively reducing power consumption of the cooler.

The present disclosure further provides an optical module. The optical module includes a housing, a circuit board, and the optical component. The optical component and the circuit board are accommodated inside the housing, and the optical component is electrically connected to the circuit board. A heat conductor is further disposed inside the housing, and the heat conductor is attached to an outer surface of a heat dissipation plate on a base of the optical component, to increase a heat dissipation area, and the heat conductor may assist the heat dissipation plate in effectively transferring heat to the housing, so as to increase heat dissipation efficiency.

The present disclosure further relates to a passive optical network (PON) system. The passive optical network system includes an optical line terminal, an optical distribution network, and at least one optical network unit. The optical line terminal is coupled to the at least one optical network unit in the optical distribution network. The optical line terminal may be an optical line terminal having an optical module, and/or the optical network unit is an optical network unit having an optical module.

The optical transmit element of the optical component in the present disclosure is directly installed on the cooling surface of the cooler, the heat dissipation plate on the base is located outside the cavity, and the cooling plate and the heat dissipation plate are placed in two different spaces. Therefore, heat inside the cavity can be effectively conducted and dissipated, so as to avoid a problem in a conventional solution that temperature inside the cavity of the packaging structure increases due to coexistence of heat absorption and heat dissipation of the cooler in one sealed environment, thereby effectively reducing power consumption of the cooler, and avoiding impact on precision of the optical transmit element.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly and describes the technical solutions in the implementations of the present disclosure with reference to the accompanying drawings in the implementations of the present disclosure.

The present disclosure provides an optical component packaging structure, an optical module, and a related apparatus and system. The optical component packaging structure is used as a packaging structure of the optical module. The optical module is applied to an optical line terminal and/or an optical network unit of a passive optical network system, to implement optical-to-electrical conversion or electrical-to-optical conversion. A passive optical network (PON) technology is a point-to-multipoint fiber transmission and access technology. In the PON, a broadcast manner is usually used in a downlink, a time division multiple access manner is usually used in an uplink, and a topology structure of a tree shape, a star shape, a bus shape, or the like can be flexibly formed.

Figure 1:
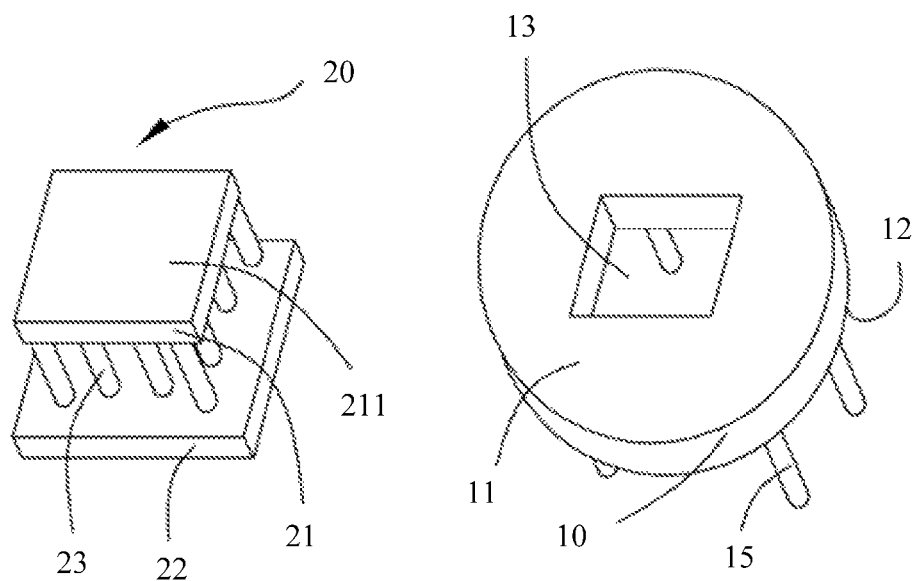
FIG. 1 is a schematic exploded diagram of a base and a cooler of an optical component packaging structure according to the present disclosure.
Figure 2:
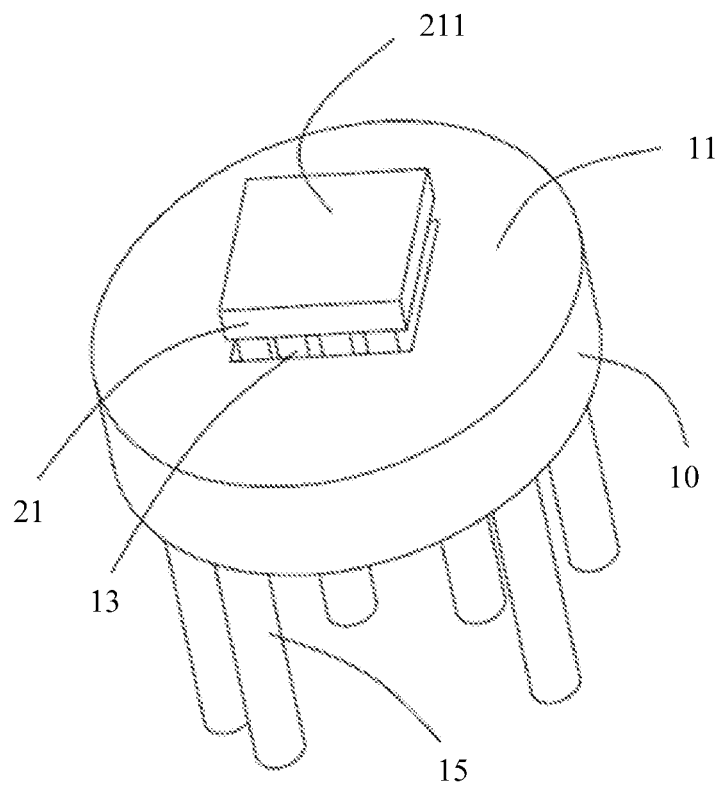
FIG. 2 is a schematic assembly diagram of the base and the cooler of the optical component packaging structure shown in FIG. 1.
Figure 3:
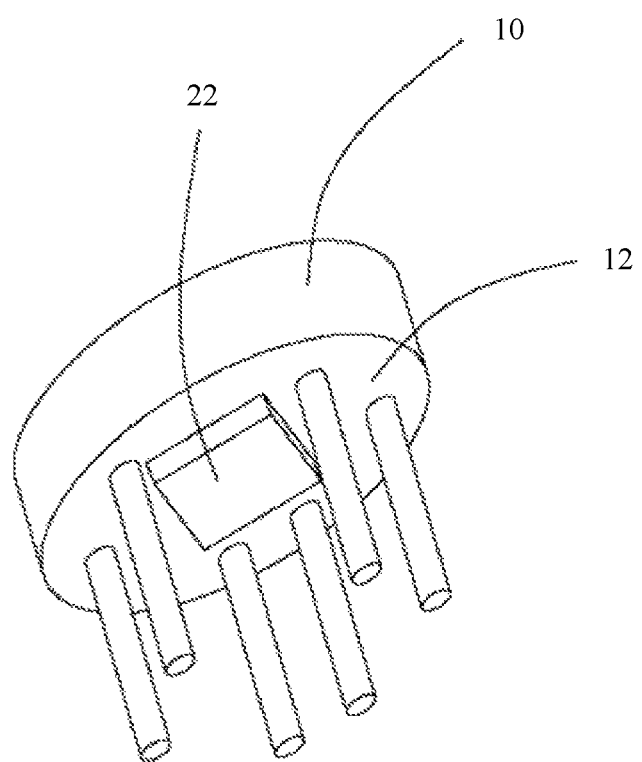
FIG. 3 is a schematic diagram of another perspective of the optical component packaging structure shown in FIG. 2.
Figure 4:
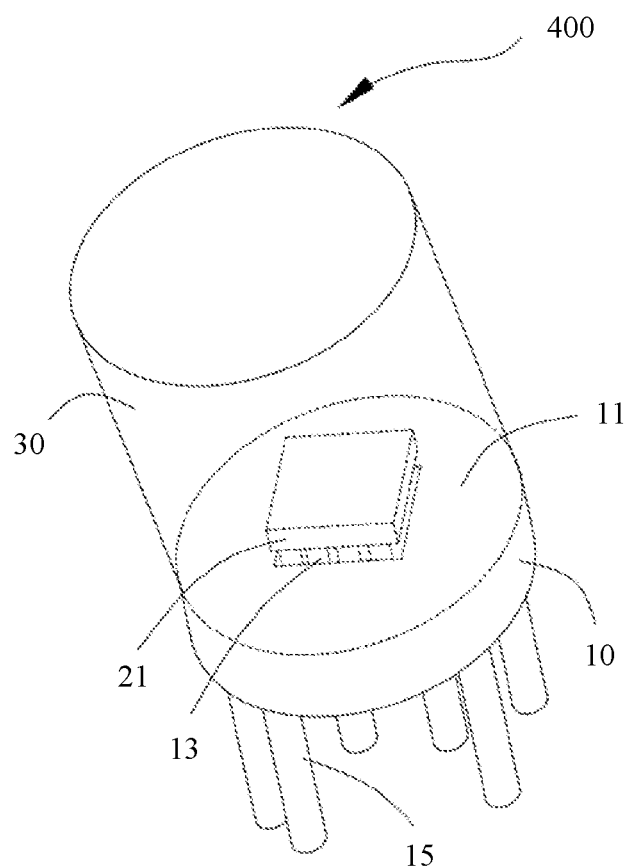
FIG. 4 is a schematic diagram of an assembly structure of an optical component packaging structure including a sealing cover according to the present disclosure.

Referring to FIG. 1 to FIG. 3, an optical component packaging structure in an embodiment of the present disclosure includes a base 10, a cooler 20, and a sealing cover 30. The base 10 includes a mounting surface 11 and a back surface 12 that faces a direction opposite to that faced by the mounting surface 11. The cooler 20 includes a cooling plate 21, a heat dissipation plate 22 disposed in parallel with the cooling plate 21 and opposite to the cooling plate 21, and a conductive connection body 23 connecting the cooling plate 21 and the heat dissipation plate 22. The cooling plate 21 includes a cooling surface 211. The cooler 20 is partially built in the base 10. The heat dissipation plate 22 protrudes from the back surface 12 and the heat dissipation plate 22 is sealedly connected to the base 10. The cooling plate 21 faces a direction the same as the mounting surface 11. Referring to FIG. 4, the sealing cover 30 covers the mounting surface 11, and the sealing cover 30 and the mounting surface 11 form a sealing cavity. In this embodiment, the sealing cover 30 is a hollow cover, and the cooling surface is accommodated inside the sealing cavity, and is configured to install an optical transmit element, for example, a laser.

The base 10 is a round pie-shaped block. The base 10 may be obtained through in-mould forming, and the cooler 20 is partially built in the base 10 by using a built-in technology. To avoid damaging the cooler 20 during formation, a protective layer may be disposed around an external side of the conductive connection body of the cooler 20, so that the conductive connection body is packaged among the protective layer, the cooling plate 21, and the heat dissipation plate 22. The cooler 20 may be disposed in the base 10 in another manner.

As shown in FIG. 1, in this embodiment, the cooler 20 and the base 10 are used as a finished product for assembling and sealing. The base 10 includes an installation through groove 13. The installation through groove 13 is provided on the mounting surface 11 and penetrates the back surface 12. The cooler 20 is accommodated in the installation through groove 13, and the heat dissipation plate is sealedly connected to the installation through groove 13. Specifically, the installation through groove 13 is a rectangular through groove and penetrates a middle part of the base 10, the cooler 20 is inserted into the installation through groove 13 from the back surface 12, and the heat dissipation plate 22 protrudes from the back surface 12, so as to effectively dissipate heat. The cooling plate 21 is located on a side, of the base 10, on which the mounting surface 11 is disposed. The cooling surface 211 may be higher than the mounting surface 11. That is, the cooling plate 21 may protrude from the mounting surface 11. Alternatively, the cooling surface 211 may be level with the mounting surface 11, or be located in the installation through groove 13 and be lower than the mounting surface 11, as long as the cooling surface 211 and the mounting surface 11 are both exposed to the outside and are not blocked. The cooling surface 211 is configured to install an optical transmit element (not shown in the figure), and may effectively dissipate, in time, heat of the optical transmit element to the outside by using the heat dissipation plate 22.

Referring to FIG. 4, further, an outer surface of the sealing cover 30 is coated with an insulation layer (not shown in the figure). The insulation layer is a thermal adhesive or another medium having a low heat conductivity factor, to prevent external heat from entering the cavity from the sealing cover, so that power consumption of the cooler can be reduced.

In the optical component packaging structure in the present disclosure, the cooling plate 21 of the cooler 20 is placed inside the cavity, the heat dissipation plate 22 is exposed out of the cavity and disposed on an external side of the base, and the cooler is integrated with the base, so that the cooling plate 21 and the heat dissipation plate 22 are disposed in two different spaces, thereby avoiding a problem in a conventional solution that temperature inside the cavity of the packaging structure increases due to coexistence of heat absorption and heat dissipation of the cooler in one sealed environment, avoiding an increase in a cooling burden of the cooler, and effectively reducing power consumption of the cooler 20.

As shown in FIG. 1, in this embodiment, the cooler 20 is a semiconductor cooler. An area of the heat dissipation plate 22 is relatively large, to increase a contact area between the heat dissipation plate and the outside, thereby facilitating quick heat dissipation of the heat dissipation plate. The conductive connection body 23 is a plurality of parallel cylinders. The conductive connection body connects the cooling plate 21 and the heat dissipation plate 22. The cooling plate 21 is disposed in parallel with the heat dissipation plate 22 and opposite to the heat dissipation plate 22. The cooling surface 211 is a surface away from the heat dissipation plate 22 and the conductive connection body 23. Correspondingly, after the cooler 20 is inserted into the installation through groove from the back surface 12, the heat dissipation plate 22 may completely obstruct a groove opening, located on the back surface 12, of the installation through groove 13, or may be exactly installed in the groove opening.

Further, a peripheral side surface of the heat dissipation plate 22 is sealedly connected to the installation through groove 13 in a manner of gold-tin soldering or sticking. When the heat dissipation plate 22 can be exactly installed in the groove opening, the heat dissipation plate 22 is partially or completely exposed out of the installation through groove 13. When the heat dissipation plate 22 can completely obstruct the groove opening, located on the back surface 12, of the installation through groove 13, a surface peripheral edge that is of the heat dissipation plate 22 and that faces the cooling plate 21 is sealedly connected to the back surface 12 at a peripheral edge of the groove opening. Sealing of the heat dissipation plate 22 and the installation through groove 13 is to isolate the cavity formed by the base 10 and the sealing cover 30 from the outside, thereby preventing an external factor from affecting performance of the cavity.

Further, several conductive connection pins 15 are further disposed on the base 10, and the conductive connection pins 15 are used for cable arrangement of the optical component packaging structure. The conductive connection pins 15 are configured to electrically connect to a circuit board in an optical module. In another implementation, the base 10 performs signal transmission and cable arrangement by using a ceramic conductive connection body 15 (referring to FIG. 6) penetrating the mounting surface 11 and the back surface 12.

The present disclosure further provides an optical component 400. The optical component 400 includes the optical component packaging structure (shown in FIG. 4) and an optical transmit element (not shown in the figure). The optical transmit element is disposed on the cooling surface 211 on the base 10. Specifically, for example, the optical component in the present disclosure is a single-fiber unidirectional optical component. The optical transmit element is a laser, and is disposed inside the cavity formed by the sealing cover 30 and the base 10. An optical receiver is disposed inside the cavity opposite to the optical transmit element 40. The optical component may be in another form in the prior art, as long as the optical component packaging structure in the present disclosure can be applied to the optical component. The optical transmit element of the optical component in the present disclosure is directly disposed on the cooling surface 211 of the cooler 20, the heat dissipation plate 22 is located outside the cavity, and the cooling plate 21 and the heat dissipation plate 22 are placed in two different spaces. Therefore, heat inside the cavity can be effectively conducted and dissipated, so as to avoid a problem in a conventional solution that a current of the cooler increases due to an increase in temperature inside the cavity of the optical component, thereby avoiding impact on precision of a transmit wavelength of the optical transmit element, and effectively reducing power consumption of the cooler 20. It can be understood that the optical component 400 may further include an optical receiver, so as to constitute an optical component that has receiving and sending performance and that can perform receiving and sending.

Figure 5:
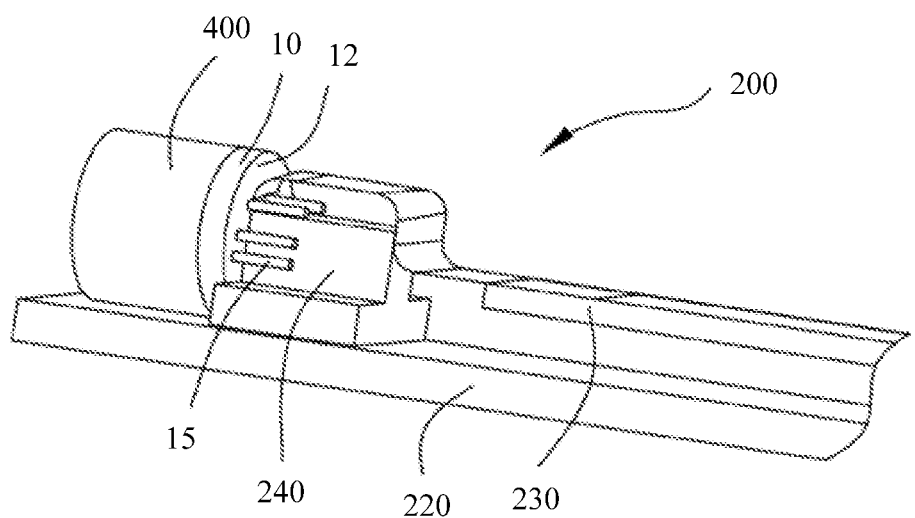
FIG. 5 is a schematic structural diagram of an optical module according to the present disclosure, where the optical module includes an optical component using the optical component packaging structure in FIG. 4.
Figure 6:
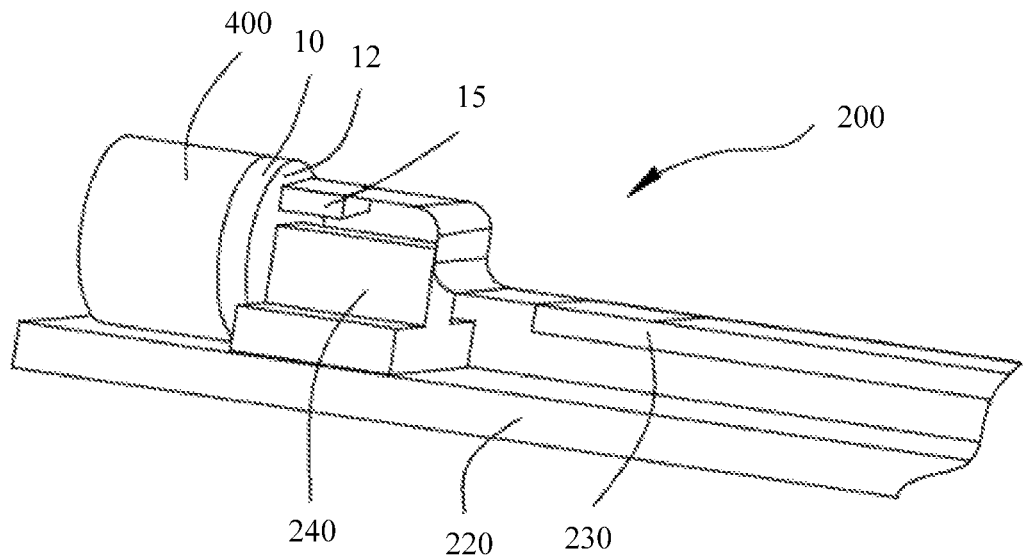
FIG. 6 is a schematic structural diagram of an optical module in another embodiment of a conductive connection pin of the optical component shown in FIG. 5 according to the present disclosure.

Referring to FIG. 5 and FIG. 6, the present disclosure further provides an optical module 200 and a passive optical network system to which the optical module 200 is applied. The optical module 200 is mainly configured to implement optical-to-electrical conversion and electrical-to-optical conversion, that is, convert a to-be-sent data signal into an optical signal and send the optical signal to a peer end by using an optical fiber, and after receiving, from the optical fiber, an optical signal sent by the peer end and converting the optical signal into an electrical signal, recover received data from the electrical signal. The optical module 200 is a pluggable optical module integrating an optical signal receiving and sending function, an optical-to-electrical conversion function, and an Optical Time Domain Reflectometer (OTDR) test function. The optical module 200 includes a housing 220, a circuit board 230, and the optical component 400. The optical component 400 and the circuit board 230 are accommodated inside the housing 220, and the optical component 400 is electrically connected to the circuit board 230. A difference between the optical module in FIG. 5 and the optical module in FIG. 6 is that the optical component is connected to the circuit board in two different manners: a conductive connection pin 15 and a ceramic conductive connection body 15. The optical component applied to the optical module 200 may be an optical component having receiving and sending optical performance or an optical component having transmit performance, and is not limited herein.

Further, a heat conductor 240 is further disposed inside the housing 220, and the heat conductor 240 is attached to the heat dissipation plate 22 on the base 10 of the optical component 400. Because the heat dissipation plate is disposed outside the sealing cavity of the optical component, there is sufficient space to increase an area of the heat dissipation plate, so as to increase a contact area between the heat dissipation plate and the heat conductor, to accelerate heat dissipation. The heat conductor may assist the heat dissipation plate 22 in effectively transferring heat to the housing, so as to increase heat dissipation efficiency.

Figure 7:
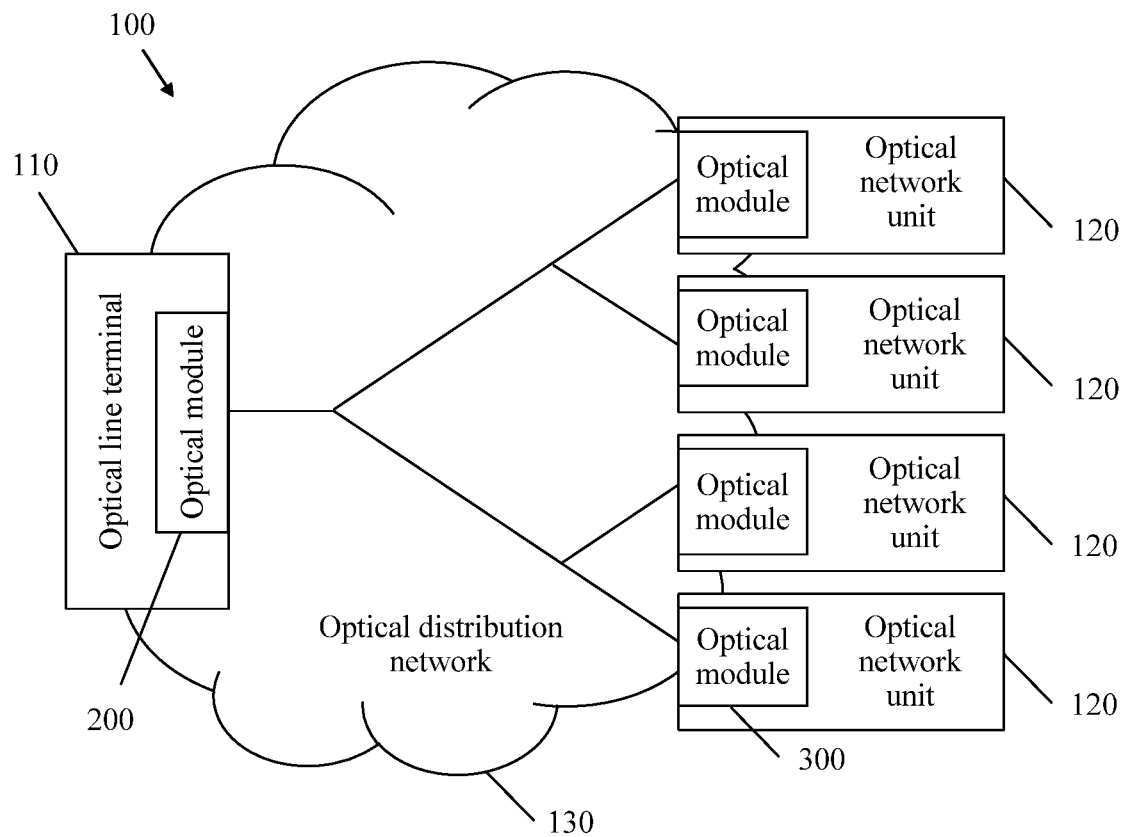
FIG. 7 is a schematic diagram of a passive optical network system having the optical module according to the present disclosure.

As shown in FIG. 7, FIG. 7 is a schematic diagram of a network architecture of a PON system to which the optical module 200 can be applied according to this application. A passive optical network system 100 includes an optical line terminal (OLT) 110, a plurality of optical network units (ONU) 120, and one optical distribution network (ODN) 130. Each optical line terminal 110 is connected to the plurality of optical network units 120 in a point-to-multipoint manner by using the optical distribution network 130. The optical line terminal 110 may communicate with the optical network units 120 by using a Time Division Multiplexing (TDM) mechanism, a Wave Division Multiplexing (WDM) mechanism, or a TDM/WDM mixed mechanism. A direction from the optical line terminal 110 to the optical network unit 120 is defined as a downlink direction, and a direction from the optical network unit 120 to the optical line terminal 110 is an uplink direction. The passive optical network system 100 may be a communications network that implements data distribution between the optical line terminal 110 and the optical network unit 120 without need of any active device. In a specific embodiment, data distribution between the optical line terminal 110 and the optical network unit 120 may be implemented by using a passive optical device (for example, a splitter) in the optical distribution network 130. The passive optical network system 100 may be an asynchronous transfer mode passive optical network (ATM PON) system or a broadband passive optical network (BPON) system defined that is defined by the ITU-T G983 standard, a gigabit passive optical network (GPON) system defined by the ITU-T G.984 family of standards, an Ethernet passive optical network (EPON) defined by the IEEE 802.3ah standard, a wavelength division multiplexing passive optical network (WDM PON) system, or a next generation passive optical network (NG PON) system, such as an XGPON system defined by the ITU-T G987 family of standards, a 10G EPON system defined by the IEEE 802.3av standard, or a TDM/WDM mixed PON system. All content of the various passive optical network systems defined by the foregoing standards is incorporated herein by reference.

The optical line terminal 110 is usually located at a center location (for example, a central office, CO), and may manage the plurality of optical network units 120 together. The optical line terminal 110 may act as a medium between the optical network unit 120 and an upper-layer network (not shown in the figure), use data received from the upper-layer network as downlink data and forward the downlink data to the optical network unit 120, and forward, to the upper-layer network, uplink data received from the optical network unit 120. A specific structure configuration of the optical line terminal 110 may vary with a specific type of the passive optical network system 100. In an embodiment, the optical line terminal 110 may include the optical module 200 and a data processing module (not shown in the figure). The optical module 200 may convert downlink data processed by the data processing module into a downlink optical signal and send the downlink optical signal to the optical network unit 120 by using the optical distribution network 130; and receive an uplink optical signal that is sent by the optical network unit 120 by using the optical distribution network 130, convert the uplink optical signal into an electrical signal, and provide the electrical signal to the data processing module for processing.

The optical network units 120 may be disposed in a distributed manner at a location (for example, customer premises) on a user side. The optical network unit 120 may be a network device configured to communicate with the optical line terminal 110 and a user. Specifically, the optical network unit 120 may act as a medium between the optical line terminal 110 and the user. For example, the optical network unit 120 may forward, to the user, downlink data received from the optical line terminal 110; and use data received from the user as uplink data, and forward the uplink data to the optical line terminal 110. A specific structure configuration of the optical network unit 120 may vary with the specific type of the passive optical network system 100. In an embodiment, the optical network unit 120 may include an optical module 300. The optical module 300 is configured to: receive a downlink data signal that is sent by the optical line terminal 110 by using the optical distribution network 130, and send an uplink data signal to the optical line terminal 110 by using the optical distribution network 130. It should be understood that, in the present disclosure, a structure of the optical network unit 120 is similar to a structure of an optical network terminal (ONT). Therefore, in the solution provided in the present disclosure, the optical network unit may interchange with the optical network terminal.

The optical distribution network 130 may be a data distribution system, and may include an optical fiber, an optical coupler, an optical multiplexer/demultiplexer, an optical splitter, and/or another device. In an embodiment, the optical fiber, the optical coupler, the optical multiplexer/demultiplexer, the optical splitter, and/or another device may be a passive optical device. Specifically, the optical coupler, the optical multiplexer/demultiplexer, the optical splitter, and/or another device may be a device that distributes a data signal between the optical line terminal 110 and the optical network unit 120 without being supported by a power supply. In addition, in another embodiment, the optical distribution network 130 may further include one or more processing device, for example, an optical amplifier or a relay device. In a branch structure shown in FIG. 1, the optical distribution network 130 may specifically extend from the optical line terminal 110 to the plurality of optical network units 120, but may be configured as any other point-to-multipoint structure.

It should be noted that the optical module 200 and/or the optical module 300 may be the optical module in the foregoing embodiments of the present disclosure. In this embodiment, using the optical module 200 of the optical line terminal 110 as an example, the optical module includes at least an optical transmit element and an optical receiving element (not shown in the figure). The optical transmit element is configured to deliver a downlink data signal to the optical network unit 120 by using the optical distribution network 130. The optical receiving element is configured to: receive an uplink data signal transferred from the optical network unit 120 by using the optical distribution network 130, convert the uplink data signal into an electrical signal through optical-to-electrical conversion, and forward the electrical signal to a control module or the data processing module (not shown in the figure) of the optical line terminal 110 for processing. The optical line terminal includes the optical module described in the embodiments corresponding to FIG. 5 and FIG. 6. The optical network unit may also include the optical module described in the embodiments corresponding to FIG. 5 and FIG. 6. Details are not described herein again.

According to the passive optical network system provided in this embodiment of the present disclosure, the optical transmit element of the optical component that can be used by the optical line terminal and the optical network unit is directly disposed on the cooling surface of the cooler, the heat dissipation plate on the base is located outside the cavity, and the cooling plate and the heat dissipation plate are placed in two different spaces. Therefore, heat inside the cavity can be effectively conducted and dissipated, so as to avoid a problem in a conventional solution that temperature inside the cavity of a packaging structure increases due to coexistence of heat absorption and heat dissipation of the cooler in one sealed environment, thereby effectively reducing power consumption of the cooler, avoiding impact on precision of the optical transmit element, and improving performance of the system.

The foregoing descriptions are example implementations of the present disclosure. It should be noted that a person of ordinary skill in the art may make improvements and polishing without departing from the principle of the present disclosure and the improvements and polishing shall fall within the protection scope of the present disclosure.

What is claimed is:

1. An optical component, comprising an optical component packaging structure, wherein the optical component packaging structure comprises a base, a sealing cover, and a cooler, wherein the base comprises a mounting surface and a back surface that faces a direction opposite to that faced by the mounting surface, the cooler comprises a cooling plate, a heat dissipation plate disposed opposite to the cooling plate, and a conductive connection body connecting the cooling plate and the heat dissipation plate, the cooling plate comprises a cooling surface, the cooler is partially built in the base, the cooling plate faces a direction the same as the mounting surface, the sealing cover covers the mounting surface, the sealing cover and the mounting surface form a sealing cavity, the cooling surface is located inside the sealing cavity, and the heat dissipation plate protrudes from the back surface and is sealedly connected to the base.

2. The optical component according to claim 1, wherein the base comprises an installation through groove, the installation through groove is provided on the mounting surface and penetrates the back surface, and the cooler is partially accommodated in the installation through groove.

3. The optical component according to claim 2, wherein the heat dissipation plate comprises a peripheral side surface, and the peripheral side surface is sealedly connected to the installation through groove in a manner of soldering or sticking.

4. The optical component according to claim 1, wherein an outer surface of the sealing cover is coated with an insulation layer.

5. The optical component according to claim 1, wherein several conductive connection pins are further disposed on the base, and the conductive connection pins are used for cable arrangement of the optical component packaging structure.

6. The optical component according to claim 1, wherein a ceramic conductive connection body penetrating the mounting surface and the back surface is further disposed on the base.

7. The optical component according to claim 1, wherein an area of the cooling plate is less than an area of the heat dissipation plate.

8. The optical component according to claim 1, wherein the optical component comprises an optical transmit element, wherein the optical transmit element is disposed on the cooling surface of the cooling plate.

9. An optical module, wherein the optical module comprises a housing, a circuit board, and an optical component comprising an optical component packaging structure, wherein the optical component packaging structure comprises a base, a sealing cover, and a cooler, wherein the base comprises a mounting surface and a back surface that faces a direction opposite to that faced by the mounting surface, the cooler comprises a cooling plate, a heat dissipation plate disposed opposite to the cooling plate, and a conductive connection body connecting the cooling plate and the heat dissipation plate, the cooling plate comprises a cooling surface, the cooler is partially built in the base, the cooling plate faces a direction the same as the mounting surface, the sealing cover covers the mounting surface, the sealing cover and the mounting surface form a sealing cavity, the cooling surface is located inside the sealing cavity, and the heat dissipation plate protrudes from the back surface and is sealedly connected to the base, and wherein the optical component and the circuit board are accommodated inside the housing, and the optical component is electrically connected to the circuit board.

10. The optical module according to claim 9, wherein a heat conductor is further disposed inside the housing, and the heat conductor is attached to the heat dissipation plate on the base of the optical component.

11. The optical module according to claim 9, wherein the base comprises an installation through groove, the installation through groove is provided on the mounting surface and penetrates the back surface, and the cooler is partially accommodated in the installation through groove.

12. The optical module according to claim 11, wherein the heat dissipation plate comprises a peripheral side surface, and the peripheral side surface is sealedly connected to the installation through groove in a manner of soldering or sticking.

13. The optical module according to claim 9, wherein an outer surface of the sealing cover is coated with an insulation layer.

14. The optical module according to claim 9, wherein several conductive connection pins are further disposed on the base, and the conductive connection pins are used for cable arrangement of the optical component packaging structure.

15. An apparatus, comprising an optical module, wherein the optical module comprises a housing, a circuit board, and an optical component comprising an optical component packaging structure, wherein the optical component packaging structure comprises a base, a sealing cover, and a cooler, wherein the base comprises a mounting surface and a back surface that faces a direction opposite to that faced by the mounting surface, the cooler comprises a cooling plate, a heat dissipation plate disposed opposite to the cooling plate, and a conductive connection body connecting the cooling plate and the heat dissipation plate, the cooling plate comprises a cooling surface, the cooler is partially built in the base, the cooling plate faces a direction the same as the mounting surface, the sealing cover covers the mounting surface, the sealing cover and the mounting surface form a sealing cavity, the cooling surface is located inside the sealing cavity, and the heat dissipation plate protrudes from the back surface and is sealedly connected to the base, and wherein the optical component and the circuit board are accommodated inside the housing, and the optical component is electrically connected to the circuit board, wherein the apparatus is an optical network unit or an optical line terminal.

16. The apparatus according to claim 15, wherein the base comprises an installation through groove, the installation through groove is provided on the mounting surface and penetrates the back surface, and the cooler is partially accommodated in the installation through groove.

17. The apparatus according to claim 16, wherein the heat dissipation plate comprises a peripheral side surface, and the peripheral side surface is sealedly connected to the installation through groove in a manner of soldering or sticking.

18. The apparatus according to claim 15, wherein a ceramic conductive connection body penetrating the mounting surface and the back surface is further disposed on the base.

19. The apparatus according to claim 15, wherein an area of the cooling plate is less than an area of the heat dissipation plate.

* * * * *